(12) United States Patent
Byun et al.

(10) Patent No.: US 9,767,869 B2
(45) Date of Patent: Sep. 19, 2017

(54) MEMORY CONTROLLER, MEMORY SYSTEM INCLUDING THE SAME, AND ELECTRONIC DEVICE INCLUDING THE MEMORY SYSTEM

(71) Applicant: Samsung Electronics Co., Ltd., Suwon-si (KR)

(72) Inventors: Hyunil Byun, Seongnam-si (KR); In Sung Joe, Seoul (KR); Dong Jae Shin, Seoul (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 75 days.

(21) Appl. No.: 14/791,356

(22) Filed: Jul. 3, 2015

(65) Prior Publication Data

US 2016/0099781 A1 Apr. 7, 2016

(30) Foreign Application Priority Data

Oct. 7, 2014 (KR) .......................... 10-2014-0135065

(51) Int. Cl.
*H04B 10/00* (2013.01)
*G11C 7/10* (2006.01)

(52) U.S. Cl.
CPC .......... *G11C 7/1081* (2013.01); *G11C 7/1054* (2013.01)

(58) Field of Classification Search
None
See application file for complete search history.

(56) References Cited

U.S. PATENT DOCUMENTS

| 5,162,922 | A | * | 11/1992 | Takemura | ............ | H04N 9/7973 |
| | | | | | | 360/22 |
| 5,249,243 | A | | 9/1993 | Skeie | | |
| 6,160,627 | A | | 12/2000 | Ahn et al. | | |
| 7,257,283 | B1 | | 8/2007 | Liu et al. | | |
| 7,280,381 | B2 | | 10/2007 | Lee et al. | | |
| 7,606,640 | B2 | * | 10/2009 | Hirai | ...................... | G03B 21/16 |
| | | | | | | 349/5 |
| 8,401,399 | B2 | | 3/2013 | Barton et al. | | |
| 8,712,249 | B2 | | 4/2014 | Baker et al. | | |
| 8,928,349 | B2 | * | 1/2015 | Oh | ................... | H03K 19/01754 |
| | | | | | | 326/30 |
| 2011/0215344 | A1 | | 9/2011 | Dardy et al. | | |
| 2012/0155888 | A1 | * | 6/2012 | Ji | ............................ | G02B 6/30 |
| | | | | | | 398/182 |
| 2013/0170781 | A1 | | 7/2013 | Kissa et al. | | |
| 2013/0308942 | A1 | * | 11/2013 | Ji | ........................... | H04B 10/25 |
| | | | | | | 398/45 |
| 2013/0329489 | A1 | * | 12/2013 | Kim | ................... | G11C 11/1675 |
| | | | | | | 365/158 |

(Continued)

*Primary Examiner* — Tesfaldet Bocure
(74) *Attorney, Agent, or Firm* — Muir Patent Law, PLLC

(57) ABSTRACT

A memory system in accordance with an embodiment of the inventive concept includes a memory controller comprising a controller optical transmission unit photoelectrically-converting a data signal to output a first optical modulation signal and a second optical modulation signal, a first memory device which is optically connected with the memory controller to receive the first optical modulation signal, and a second memory device which is optically connected with the memory controller to receive the second optical modulation signal. The first optical modulation signal and the second optical modulation signal are complementary to each other.

20 Claims, 17 Drawing Sheets

(56) References Cited

U.S. PATENT DOCUMENTS

| | | | | |
|---|---|---|---|---|
| 2014/0016404 A1* | 1/2014 | Kim | ................... | G11C 11/165 |
| | | | | 365/158 |
| 2014/0161452 A1* | 6/2014 | Okabe | ................... | H04J 14/06 |
| | | | | 398/65 |
| 2015/0139665 A1* | 5/2015 | Duthel | ............... | H04B 10/5053 |
| | | | | 398/183 |
| 2015/0207563 A1* | 7/2015 | Cho | ................... | H04J 14/02 |
| | | | | 398/79 |
| 2015/0364178 A1* | 12/2015 | Kim | ................... | G11C 11/1673 |
| | | | | 365/66 |
| 2016/0027506 A1* | 1/2016 | Lee | ................... | G11C 13/0069 |
| | | | | 365/148 |
| 2016/0062830 A1* | 3/2016 | Cha | ................... | G11C 29/52 |
| | | | | 714/764 |

* cited by examiner

MEMORY CONTROLLER, MEMORY SYSTEM INCLUDING THE SAME, AND ELECTRONIC DEVICE INCLUDING THE MEMORY SYSTEM

CROSS-REFERENCE TO RELATED APPLICATIONS

This U.S. non-provisional patent application claims priority under 35 U.S.C. §119 to Korean Patent Application No. 10-2014-0135065, filed on Oct. 7, 2014, the entire contents of which are hereby incorporated by reference.

BACKGROUND OF THE INVENTION

This disclosure relates to a semiconductor memory controller, a memory system including the memory controller, and an electronic device including the memory system. The disclosure also relates to an optical interconnection memory system and a data processing system including the same.

An optical transmission device modulating an optical signal to transmit data is increasingly applied to various fields in which a limit of an electric wire occurs. In the case of a long distance communication network, an optical transmission device is generally used and in the case of an electrical device, as an operation speed and the amount of data being processed increase, an optical transmission method is increasingly used in a short distance communication such as board to board and chip to chip.

In a bidirectional multi drop optical interconnection structure in which one transmitter is connected to several receivers and several transmitters are connected to one receiver, an optical splitter is generally used to transmit an optical modulation signal to several receivers. Due to use of an optical splitter, a light source has to output an optical signal stronger than a required optical signal strength by a receiver of the optical signal because the output optical signal is divided into multiple optical signals to input into multiple receivers and thereby the light source consumes more power than a receiver needs.

SUMMARY

Embodiments of the inventive concept provide a memory system. The memory system may include a memory controller comprising a controller optical transmission unit configured to electrophotically convert a data signal to output a first optical modulation signal and a second optical modulation signal, a first memory device optically connected to the memory controller to receive the first optical modulation signal, and a second memory device optically connected to the memory controller to receive the second optical modulation signal. The first optical modulation signal and the second optical modulation signal are complementary to each other.

The controller optical transmission unit may comprise a light source configured to output an optical signal, and a modulation unit configured to modulate a phase of the optical signal in response to the data signal to output the first optical modulation signal and the second optical modulation signal.

The modulation unit may comprise an optical splitter configured to split the optical signal into a first optical signal and a second optical signal, a phase modulator configured to modulate a phase of the first optical signal according to the data signal, and a coupler configured to couple the first optical signal having a modulated phase to the second optical signal to output the first optical modulation signal and the second optical modulation signal. The coupler may be a directional coupler or a multimode interference coupler.

The modulation unit may comprises a first wave guide configured to receive the optical signal to output the first optical modulation signal, a circular-shaped wave guide configured to receive a part of the optical signal input into the first wave guide, a phase modulation unit configured to modulate a phase of the optical signal received to the circular-shaped wave guide according to the data signal, and a second wave guide configured to receive a part of the modulated optical signal from the circular-shaped wave guide to output the second optical modulated signal.

Each of the first memory device and the second memory device may comprise a photo detector configured to convert an optical modulation signal received from the memory controller into an electrical signal corresponding to the data signal and a buffer amplifying the converted electrical signal, and the second memory device may further comprise an inverter configured to invert the amplified electrical signal to output the inverted electrical signal.

Each of the first memory device and the second memory device may comprise a device optical transmission unit configured to electrophotically-convert a data signal read in a read operation to output the electrophotically-converted data signal to the memory controller. The memory controller may comprise a controller optical reception unit configured to receive the electrophotically-converted data signal to output an electrical signal corresponding to the data signal read in the read operation.

The controller optical reception unit may comprise a first and a second photo detectors configured to receive optical signals from each device optical transmission unit of the first memory device and the second memory device and to convert the received optical signals into electrical signals, and a buffer configured to amplify the converted electrical signals to output amplified electrical signals. The optical signals may be electrophotically converted signals of data signals of the memory devices, and the electrical signals correspond to the data signals.

Embodiments of the inventive concept also provide a memory system comprising memory devices, a memory controller controlling an overall operation of the memory devices and optical channels optically connecting the memory devices and the memory controller. In a write operation of the memory system, the memory controller transmits a first optical modulation signal corresponding to write data and a second optical modulation signal complementary to the first optical modulation signal to the memory devices through the optical channels. Each of the memory devices comprises a device optical reception unit receiving the first optical modulation signal or the second optical modulation signal to convert the received optical modulation signal into a data signal corresponding to the write data and then output the converted data signal.

Embodiments of the inventive concept also provide a data processing system including a central processing unit performing a data arithmetic operation and memory devices which are optically combined with the central processing unit to store data or read the stored data. The central processing unit comprises an interface unit for interfacing with the memory devices. The interface unit comprises an optical transmission unit optically converting a data signal to output a first optical modulation signal and a second optical modulation signal; and an optical reception unit receiving a third optical modulation signal obtained by optically converting data read from the memory devices. The first optical modulation signal and the second optical modulation signal are complementary to each other.

Embodiments of the disclosure also provide a memory controller including an optical signal transmitter configured to convert a data signal electrophotically, to output a first optical modulation signal and a second optical modulation signal, and to transmit the first optical modulation signal and the second optical modulation signal to a first memory device and to a second memory device respectively. The first optical modulation signal and the second optical modulation signal may be complementary to each other.

The memory controller may further includes a light source configured to output an optical signal, and a modulator configured to modulate the phase of the optical signal in response to the data signal to output the first optical modulation signal and the second optical signal.

The modulator may include an optical splitter configured to split the optical signal into a first optical signal and a second optical signal, a phase modulator configured to modulate the phase of the first optical signal according to the data signal, and a coupler configured to couple the first optical signal having a modulated phase to the second optical signal to output the first optical modulation signal and the second optical modulation signal. The coupler may be a directional coupler or a multimode inference coupler.

The memory controller may further include an optical receiver configured to receive optical signals and convert the optical signals photoelectrically. The optical receiver may include a first and a second photo detector configured to receive the optical signals and to convert the received optical signals into electrical signals, and a buffer configured to amplify the converted electrical signals to output amplified electrical signals.

Embodiments of the disclosure also provide an electronic device including a central processing unit configured to perform a data arithmetic operation and memory devices which are optically combined with the central processing unit to store data or read the stored data, wherein the central processing unit may include an interface unit configured to interface with the memory devices. The interface unit may include an optical transmission unit configured to convert an electrical data signal into an optical signal to output a first optical modulation signal and a second optical modulation signal, wherein the first optical modulation signal and the second optical modulation signal may be complementary to each other.

The electronic device may further include an optical reception unit configured to receive a third optical modulation signal obtained by electrophotically converting data read from the memory devices. The optical transmission unit may include a light source configured to output an optical signal, and a modulation unit configured to modulate a phase of the optical signal in response to the data signal to output the first optical modulation signal and the second optical modulation signal.

The modulation unit may include a distributor configured to split the optical signal into a first optical signal and a second optical signal, a phase modulation unit configured to modulate a phase of the first optical signal according to the data signal, and a coupler configured to couple the first optical signal having a modulated phase to the second optical signal to output the first optical modulation signal and the second optical modulation signal. The coupler may be a directional coupler or a multimode interference coupler.

The modulation unit may include a first wave guide configured to receive the optical signal to output the first optical modulation signal, a circular-shaped wave guide configured to receive a part of the optical signal inputted to the first wave guide, a phase modulation unit configured to modulate a phase of the optical signal received to the circular-shaped wave guide according to the data signal, and a second wave guide configured to receive a part of the modulated optical signal from the circular-shaped wave guide to output a second optical modulation signal.

BRIEF DESCRIPTION OF THE FIGURES

Various embodiments of the inventive concept will be described below in more detail with reference to the accompanying drawings. The embodiments of the inventive concept may, however, be embodied in different forms and should not be construed as limited to the embodiments set forth herein. Like numbers refer to like elements throughout.

DETAILED DESCRIPTION

Figure 1:
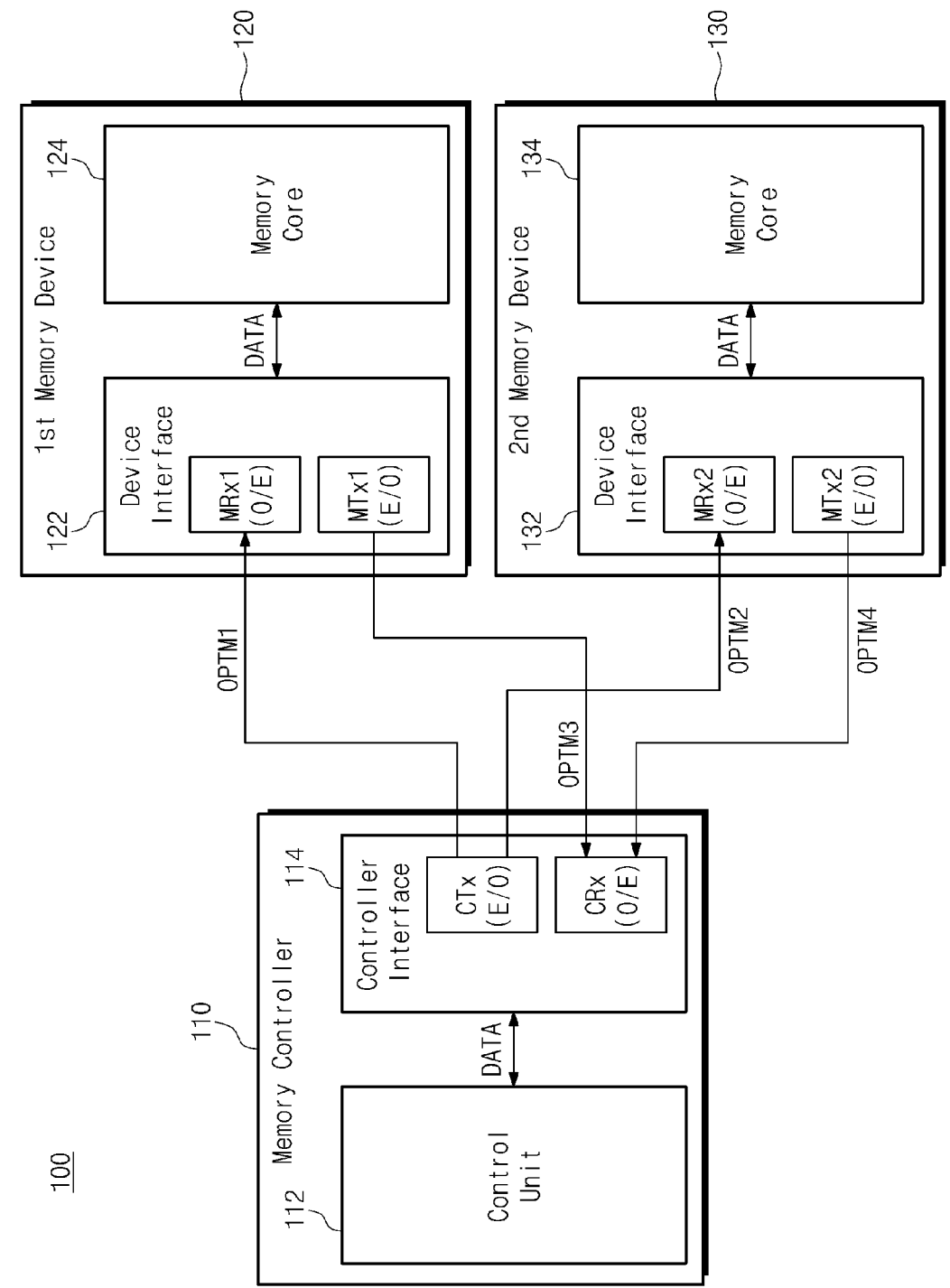
FIG. 1 is a block diagram illustrating a memory system in accordance with an embodiment of the inventive concept.

Embodiments of inventive concepts will be described more fully hereinafter with reference to the accompanying drawings, in which embodiments of the invention are shown. This inventive concept may, however, be embodied in many different forms and should not be construed as limited to the embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention. In the drawings, the sizes and relative sizes of layers and regions may be exaggerated for clarity. Like numbers refer to like elements throughout.

It will be understood that, although the terms first, second, third etc. may be used herein to describe various elements, these elements should not be limited by these terms. These terms are generally used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, a semiconductor device may refer to any of the various devices or controllers such as shown in the various figures, and may also refer, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

It will be understood that a circuit may refer to a signal transmitting means. Some circuits may transmit electrical signals. Some other circuits may transmit optical signals. Some circuits may transmit electrical signals and optical signals.

In the present disclosure, when an optical signal is converted to an electrical signal, it may be expressed that the signal is photoelectrically converted. When an electrical signal is converted into an optical signal, it may be expressed that the signal is electrophotically converted.

FIG. 1 is a block diagram illustrating a memory system in accordance with an embodiment of the inventive concept. Referring to FIG. 1, a memory system 100 may include a memory controller 110, a first memory device 120 and a second memory device 130. The memory controller 110 may include a control unit 112 and a controller interface 114. The controller interface 114 may include a controller optical transmission unit CTx transmitting data to the memory devices 120 and 130 and a controller optical reception unit CRx receiving data from the memory devices 120 and 130. The memory devices 120 and 130 may include device interfaces 122 and 132 and memory cores 124 and 134 respectively. The device interfaces 122 and 132 may include device optical transmission units MTx1 and MTx2 and device optical reception units MRx1 and MRx2 that are optically interconnected to the memory controller 110 to transmit/receive data. The memory controller 110 and the memory devices 120 and 130 are optically interconnected to each other. The device optical reception units MRx1 and MRx2 are optically interconnected to the controller optical transmission unit CTx using different optical channels from each other. The device optical transmission units MTx1 and MTx2 are optically interconnected to the controller optical reception unit CRx using different optical channels from each other. Thus in one embodiment, each memory device does not share an optical channel.

The control unit 112 transmits a data signal DATA to the controller interface 114 or receives a data signal DATA from the controller interface 114. For example, the control unit 112 may transmit write data to the controller interface 114 in a write operation of the memory system 100. The control unit 112 may receive read data read from the memory device through the controller interface 114 in a read operation of the memory system 100.

The controller interface 114 may include a controller optical transmission unit CTx and a controller optical reception unit CRx for transmitting/receiving data to/from the memory devices 120 and 130.

The controller optical transmission unit CTx performs an electrophotic conversion of a data signal received from the control unit 112 to transmit the converted data signal to the memory devices 120 and 130. For example, the controller optical transmission unit CTx converts an electrical signal received from the control unit 112 to an optical signal. In one embodiment, the controller optical transmission unit CTx outputs first and second optical modulation signals OPTM1 and OPTM2 in response to the data signal DATA. The first and second optical modulation signals OPTM1 and OPTM2 are optical modulation signals corresponding to complementary data signals. For example, if the first optical modulation signal OPTM1 is an optical modulation signal electrophotically-converted in response to a data signal in a logic high state, the second optical modulation signal OPTM2 is an optical modulation signal electrophotically-converted in response to a data signal in a logic low state.

The controller optical reception unit CRx receives optical modulation signals OPTM3 and OPTM4 from the memory devices 120 and 130. The controller optical reception unit CRx photoelectrically-converts the received optical modulation signals OPTM3 and OPTM4 to generate a data signal DATA and outputs the generated data signal DATA to the control unit 112.

The memory devices 120 and 130 may include device interfaces 122 and 132 and memory cores 124 and 134 respectively.

The device interface 122 includes a device optical reception unit MRx1 receiving the first optical modulation signal OPTM1 from the controller interface 114. The device interface 122 may also include a device optical transmission unit MTx1 performing electrophotic-conversion of a data signal DATA received from the memory core 124 to transmit the converted data signal to the controller interface 114.

The device interface 132 includes a device optical reception unit MRx2 receiving the second optical modulation signal OPTM2 from the controller interface 114. The device interface 132 may also include a device optical transmission unit MTx2 performing electrophotic-conversion of a data signal DATA received from the memory core 134 to transmit the converted data signal to the controller interface 114.

In a write operation of the memory system 100, the memory cores 124 and 134 can write data received from the device interfaces 122 and 132 in corresponding memory cells. In a read operation of the memory system 100, the memory cores 124 and 134 can read data stored in corresponding memory cells to transmit the read data to the device interfaces 122 and 132.

The memory system 100 transmits the first optical modulation signal OPTM1 optically modulated in response to and/or corresponding to write data in a write operation and the second optical modulation signal OPTM2 optically modulated in response to and/or corresponding to data complementary to the write data to the memory devices 120 and 130 respectively. For example, the first memory device 120 and the second memory device 130 can independently receive optical modulation signals complementary to each other. Thus, as compared with a case using an optical splitter for an optical interconnection of a bidirectional multi drop structure, the memory system 100 can reduce the output of a light source needed to transmit data to the memory devices 120 and 130.

In one embodiment, only one of the memory devices 120 and 130 may use the received data, and the other memory device may discard the received data. Memory controller 110 may send a selection data controlling which memory device uses the received data. For example, a write data may be written in one of the memory devices 120 and 130, and/or in a read operation only a portion of a memory cores 124 or 134 may be read by a selection data sent by the memory controller 110. In one embodiment, for a better efficiency of the memory system, both of the optical modulation signals OPTM1 and OPTM2 may be sent to corresponding memory devices even though only one of the modulation signals OPTM1 and OPTM2 is actually used for a writing operation or a reading operation.

Figure 2:
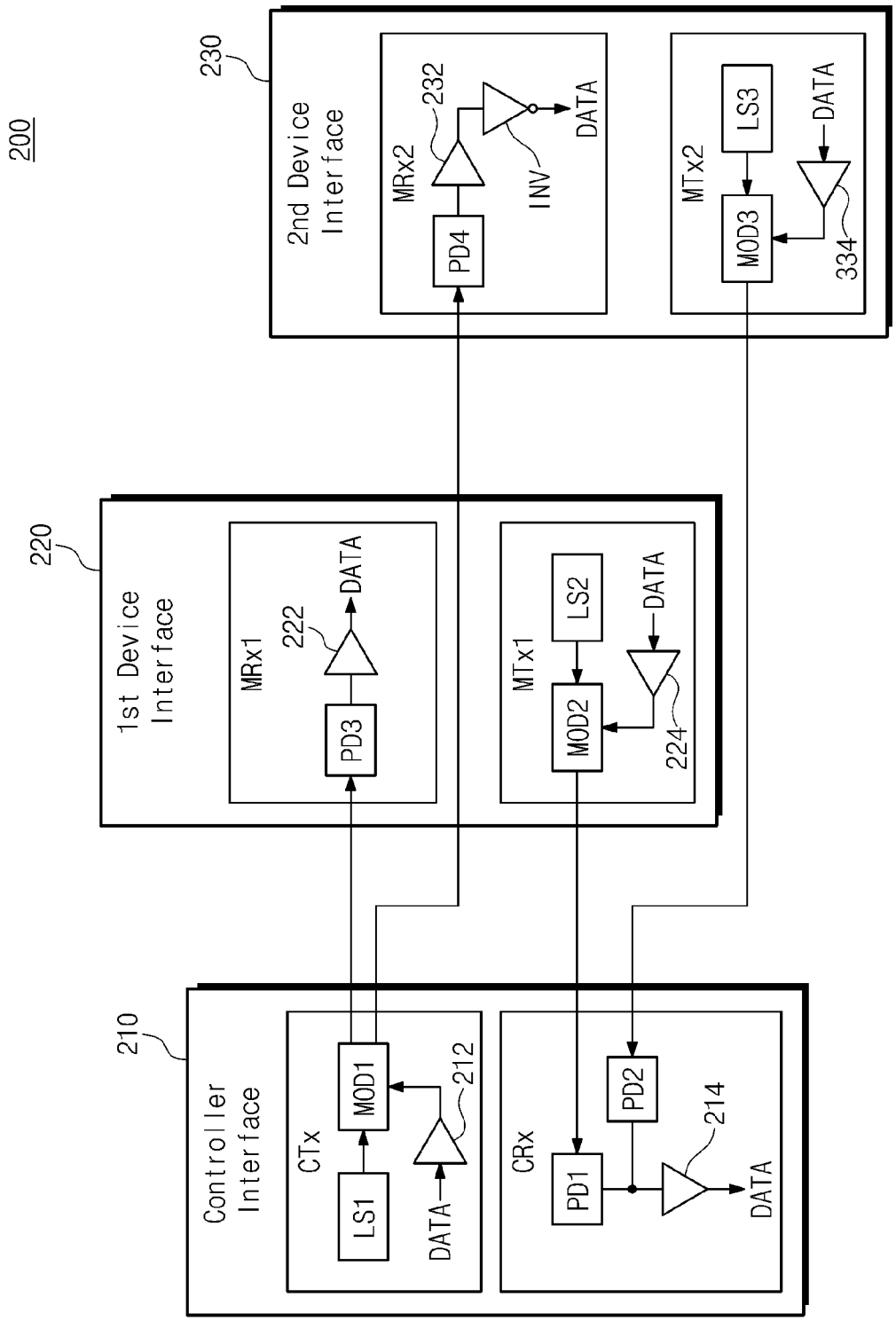
FIG. 2 is a block diagram illustrating an interface of the memory system illustrated in FIG. 1 in detail according to one exemplary embodiment.

FIG. 2 is a block diagram illustrating an exemplary embodiment of an interface of the memory system illustrated in FIG. 1. Referring to FIG. 2, a controller interface 210 may include a controller optical transmission unit CTx and a controller optical reception unit CRx. A first device interface 220 may include a device optical reception unit MRx1 and a device optical transmission unit MTx1. A second device interface 230 may include a device optical reception unit MRx2 and a device optical transmission unit MTx2. The controller optical transmission unit CTx optically modulates an optical signal in response to a data signal to be transmitted. The controller optical transmission unit CTx outputs an optical modulation signal corresponding to the data and an optical modulation signal corresponding to a signal complementary to the data signal. In one example, the controller optical transmission unit CTx outputs optical modulation signals complementary to each other to the memory devices 220 and 230 at the same time.

The controller optical transmission unit CTx may include a light source LS1, a modulation unit MOD1 and a buffer 212. The light source LS1 outputs an optical signal to the modulation unit MOD1. The buffer 212 receives a data signal to drive the modulation unit MOD1.

The modulation unit MOD1 optically modulates an optical signal in response to the data signal DATA to output optical modulation signals OPTM1 and OPTM2. The modulation unit MOD1 modulates the phase of an optical signal according to an input data signal DATA to output optical modulation signals OPTM1 and OPTM2. The optical modulation signal OPTM1 and the optical modulation signal OPTM2 are complementary to each other. For example, if the optical modulation signal OPTM1 is a sine wave signal having specific amplitude, the optical modulation signal OPTM2 may be a signal of which amplitude is zero. In one example, the optical modulation signals OPTM1 and OPTM2 are light waves. The first optical modulation signal OPTM1 may have a high level and the second optical modulation signal OPTM2 may have a low level in a predetermined time period. In this case, the first optical modulation signal OPTM1 may have a sine wave having a predetermined amplitude (high level) and the second optical modulation signal OPTM2 may have no amplitude (low level).

The controller optical reception unit CRx includes photodetectors PD1 and PD2 and a buffer 214.

The photodetector PD1 can receive an optical modulation signal OPTM3 from the device optical transmission unit MTx1 of the device interface 220. The photodetector PD1 can photoelectrically-convert the received optical modulation signal OPTM3 to output an electrical signal. The converted electrical signal is a signal corresponding to a data signal DATA optically modulated in the device optical transmission unit MTx1.

The photodetector PD2 can receive an optical modulation signal OPTM4 from the device optical transmission unit MTx2 of the device interface 230. The photodetector PD2 can photoelectrically-convert the received optical modulation signal OPTM4 to output an electrical signal.

The buffer 214 amplifies an electrical signal being output from the photodetectors PD1 and PD2 to output a data signal DATA.

The device optical reception unit MRx1 includes a photodetector PD3 and a buffer 222.

The photodetector PD3 receives the optical modulation signal OPTM1 from the controller optical transmission unit CTx and converts the received optical modulation signal OPTM1 into an electrical signal and output the electrical signal. The buffer 222 amplifies the electrical signal to output a data signal DATA. The device optical transmission unit MTx1 includes a light source LS2, a modulation unit MOD2 and a buffer 224. The light source LS2 outputs an optical signal to the modulation unit MOD2.

The modulation unit MOD2 optically modulates an optical signal in response to the data signal DATA to output an optical modulation signal OPTM3. The data signal DATA may be a signal transmitted from the memory core 124 of FIG. 1. For example, in a read operation of the memory system 100, the data signal may be a signal corresponding to a value of data stored in a corresponding memory cell of the memory core 124.

The buffer 224 receives a data signal DATA to drive the modulation unit MOD2.

The device optical transmission unit MTx2 includes a light source LS3, a modulation unit MOD3 and a buffer 234. Since the operation of each constituent element of the device optical transmission unit MTx2 is the same as that of the device optical transmission unit MTx1, a further description thereof is omitted.

The device optical reception unit MRx2 includes a photodetector PD4, a buffer 232 and an inverter INV.

The photodetector PD4 receives the optical modulation signal OPTM2 from the controller optical transmission unit CTx and converts the received optical modulation signal OPTM2 into an electrical signal to output a converted electrical signal. The optical modulation signal OPTM1 is an optical modulation signal corresponding to a data signal to be transmitted from the memory controller and the optical modulation signal OPTM2 is a signal complementary to the optical modulation signal OPTM1.

The buffer 232 amplifies an electrical signal photoelectrically-converted in the photodetector PD4 to output the amplified electrical signal to the inverter INV.

The inverter INV inverts the amplified electrical signal to output a data signal DATA.

As described above, the device optical reception unit MRx2 additionally includes the inverter INV as compared with the device optical reception unit MRx1. This is to obtain the same data signal as the data signal to be transmitted from the memory controller because the optical modulation signals OPTM1 and OPTM2 being transmitted from the controller optical transmission unit CTx are complementary to each other.

A memory system 200 uses individual optical channels when transmitting an optical modulation signal from the controller interface 210 to the device interfaces 220 and 230. In one example, the memory devices do not share an optical channel when viewed from the memory controller. Thus, the memory controller can access the memory devices at the same time.

Figure 3A:
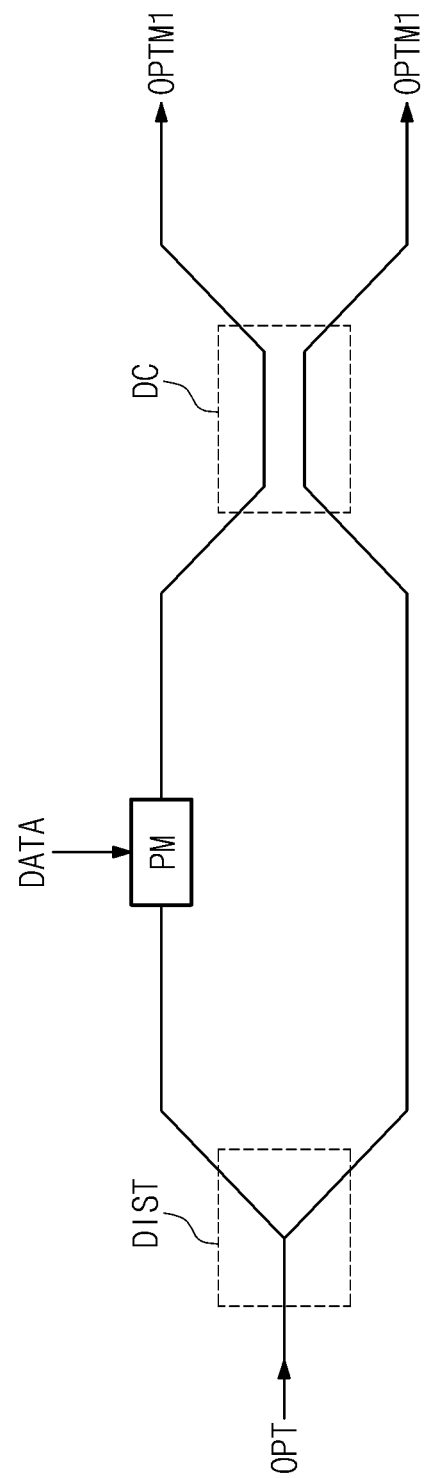
FIGS. 3A through 3C are drawings illustrating a structure of a modulation unit of a controller optical transmission unit CTx in accordance with an embodiment of the inventive concept.
Figure 3B:
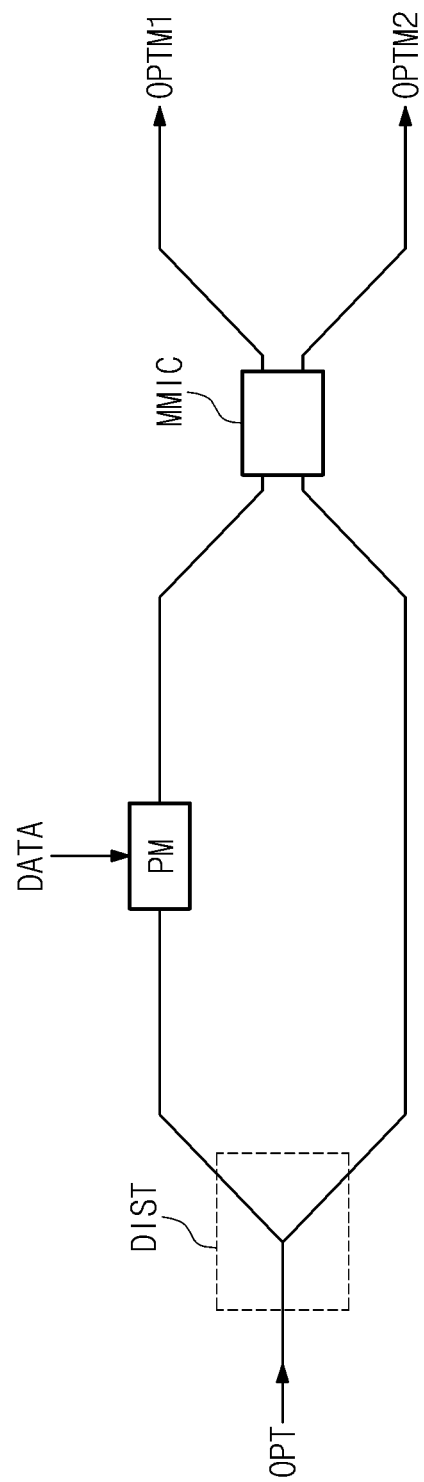
Figure 3C:
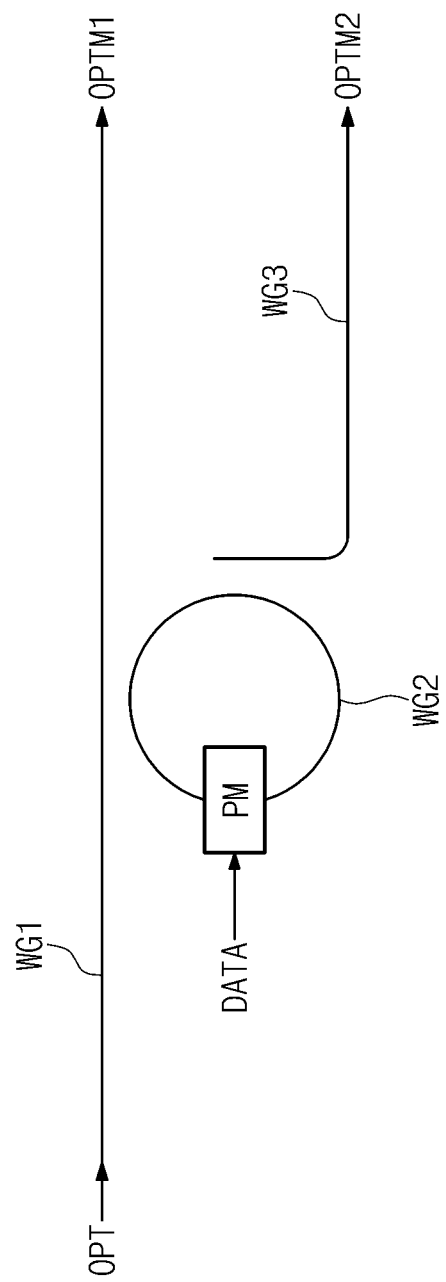

FIGS. 3A through 3C are drawings illustrating a structure of a modulation unit of a controller optical transmission unit CTx in accordance with an embodiment of the inventive concept. FIGS. 3A and 3B are based on a MZI (mach zhender interferometer) type optical modulator and FIG. 3C is based on a ring type optical modulator.

FIG. 3A is an embodiment of the MZI type optical modulator and includes an optical distributor DIST, a phase modulator PM, and a directional coupler (DC).

The optical distributor DIST splits an inputted optical signal (OPT) into two split optical signals. In this case, amplitude of the split optical signal may be half of that of the inputted optical signal OPT.

The phase modulator PM modulates a phase of one of the split optical signals in response to the data signal DATA. For example, in the case that a digital value of the data signal DATA being input is '1', the phase modulator PM can change a phase of the split optical signal by 180 degrees. In the case that a digital value of the data signal DATA being input is '0', the phase modulator PM does not change the phase of the split optical signal.

The directional coupler DC couples an output signal of the phase modulator PM and a split optical signal to output optical modulation signals OPTM1 and OPTM2. The optical modulation signals OPTM1 and OPTM2 are complementary to each other. In the case that a digital value of a data signal DATA being input is '1', the optical modulation signal OPTM1 may be a signal optically modulated in response to the value '1'. In this case, the optical modulation signal OPTM2 may be the same signal as a signal optically modulated in response to the value '0'.

FIG. 3B is another embodiment of the MZI type optical modulator and includes an optical distributor DIST, a phase modulator PM, and a multimode interference coupler (MMIC).

The optical modulator of FIG. 3B is the same as that of FIG. 3A except that the directional coupler DC is replaced by the multimode interference coupler (MMIC). That is, to output the optical modulation signals OPTM1 and OPTM2 that are complementary to each other, FIG. 3A uses the directional coupler DC and FIG. 3B uses the multimode interference coupler (MMIC).

FIG. 3C is an embodiment of the ring type optical modulator, and includes first through third waveguides WG1, WG2 and WG3 and a phase modulator PM.

The first waveguide WG1 is input with an optical signal OPT. The first waveguide WG1 outputs an optical modulation signal OPTM1.

The second waveguide WG2 is a circular-shaped waveguide and is located near to the first waveguide WG1. A part of the optical signal OPT input into the first waveguide WG1 flows into the second waveguide WG2 due to a coupling phenomenon.

The phase modulator PM modulates a phase of the optical signal which flowed into the second waveguide WG2 in response to the data signal DATA.

The third waveguide WG3 is located close to the second waveguide WG2 and a part of the optical signal of the second waveguide WG2 flows into the third waveguide WG3 due to a coupling phenomenon and then an optical modulation signal OPTM2 is output.

The optical modulation signal OPTM1 which is an output signal of the first waveguide WG1 and the optical modulation signal OPTM2 which is an output signal of the third waveguide WG3 are signals that are complementary to each other.

In the case that the modulation unit MOD1 of the controller optical transmission unit CTx is constituted by one of the three optical modulators described above, the optical modulation signals OPTM1 and OPTM2 which are output signals have the same strength as the optical signal OPT which is an input signal. In one example, the amplitude of the optical modulation signals OPTM1 and OPTM2 are the same as that of the optical signal OPT. Therefore, certain embodiments may realize an advantage in power consumption compared to a case where the strength of the output signal is weaker than the strength of the input signal. The latter case may need to increase the strength of the light source LS1 compared to the disclosed embodiments to gain enough strength of the output signals.

Figure 4A:
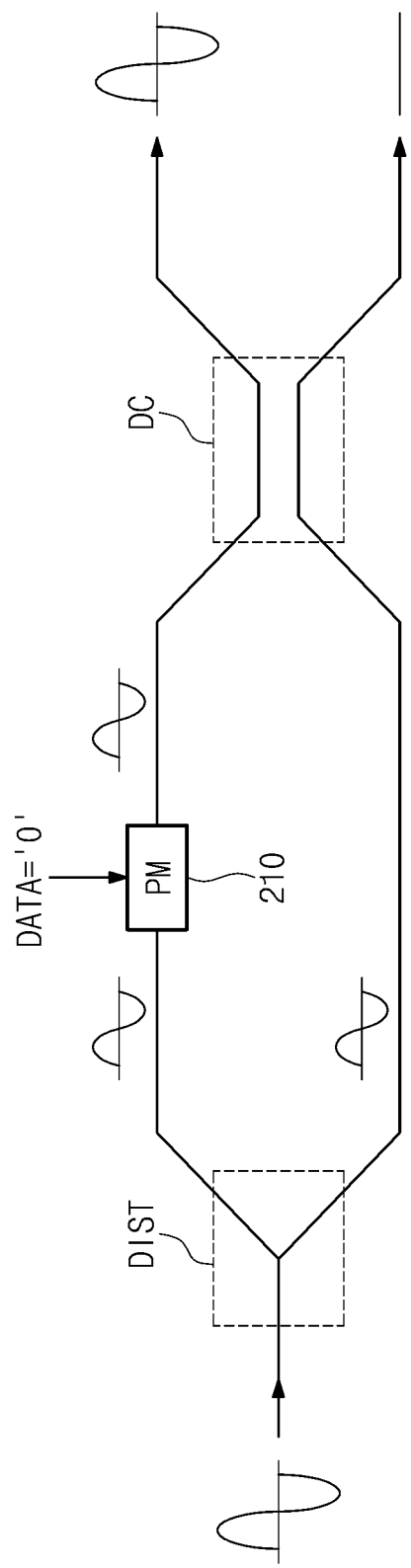
FIGS. 4A and 4B are drawings for explaining an operation of an optical modulator of FIG. 3A according to one exemplary embodiment.
Figure 4B:
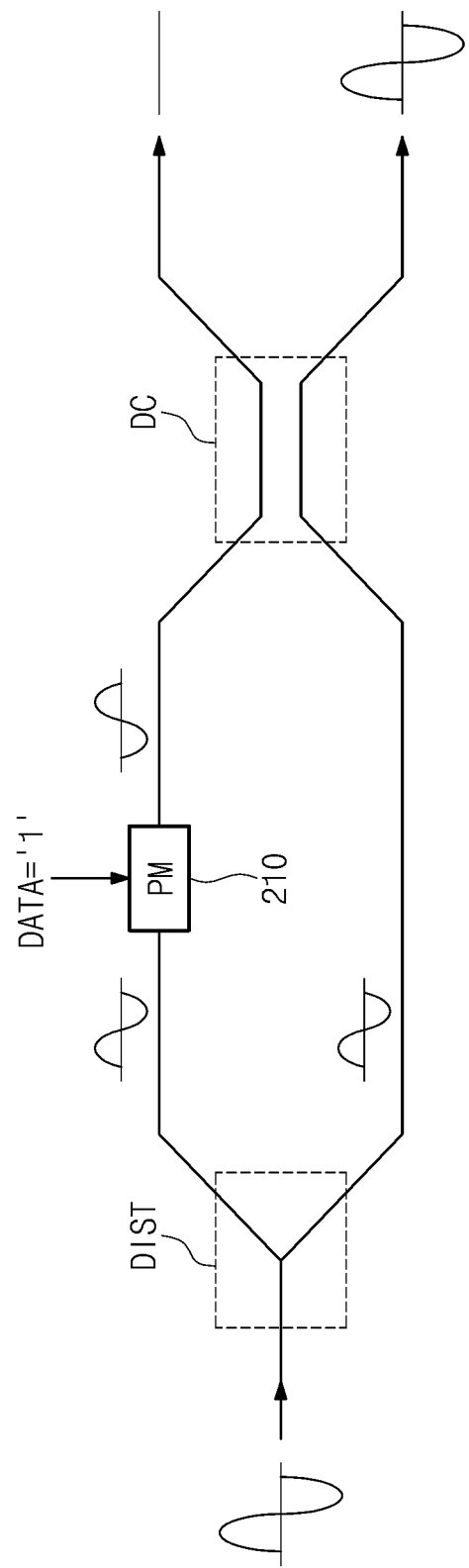

FIGS. 4A and 4B are drawings for explaining an operation of an optical modulator of FIG. 3A. FIG. 4A illustrates an operation of the case where the digital value of an input data signal DATA is '0' and FIG. 4B illustrates an operation of the case that the digital value of an input data signal DATA is '1'.

Referring to FIG. 4A, an optical signal of a sine wave shape is input to an optical modulator. The inputted optical signal is split into two optical signals in an optical distributor DIST. Amplitude of the split optical signal may be half of that of the inputted optical signal. The phase of one of the split optical signals is modulated in a phase modulator PM in response to the data signal DATA. In the case where the digital value of the data signal DATA is '0', the phase modulator PM does not modulate the phase of the split optical signal. Thus, the split optical signal having the same amplitude and phase is input to a directional coupler DC. Due to a coupling phenomenon, optical signals input to the directional coupler DC are output as an optical signal which is the same as the inputted optical signal and an optical modulation signal of which amplitude is zero. As such, the output signals of the directional coupler DC are complementary to each other.

Referring to FIG. 4B, an optical signal of a sine wave shape is input to an optical modulator. The inputted optical signal is split into two optical signals in an optical distributor DIST. Amplitude of the split optical signal may be half of that of the inputted optical signal. The phase of one of the split optical signals is modulated in a phase modulator PM in response to the data signal DATA. In the case where the digital value of the data signal DATA is '1', the phase modulator PM shifts the phase of the split optical signal 180 degrees. Thus, optical signals of which phases are different from each other by 180 degrees are input to a directional coupler DC. Due to a coupling phenomenon, optical signals input to the directional coupler DC are output as an optical modulation signal which is the same as the inputted optical signal and an optical modulation signal of which amplitude is zero.

A difference of operations of FIGS. 4A and 4B described above is that optical modulation signals being output from an output stage of the directional coupler DC become opposite to each other depending on data DATA being input.

Figure 5:
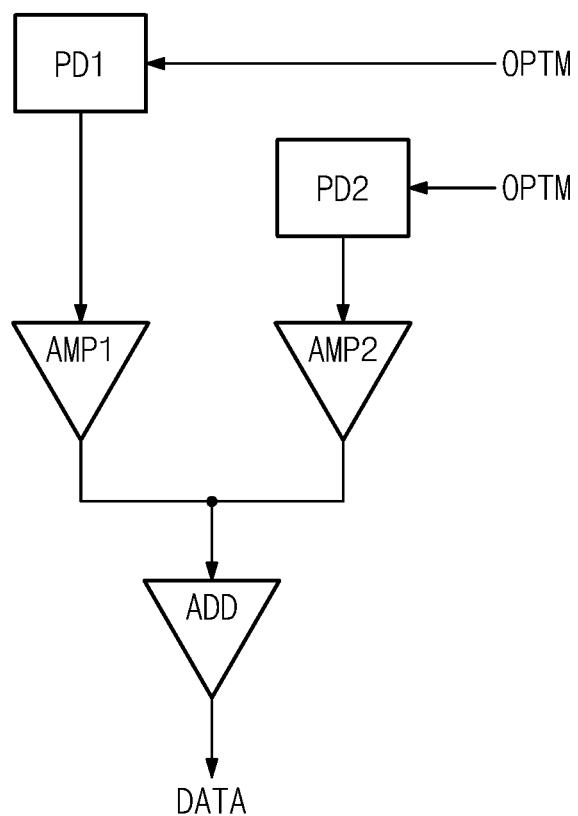
FIG. 5 is a drawing illustrating a controller optical reception unit in accordance with another embodiment of the inventive concept.

FIG. 5 is a drawing illustrating a controller optical reception unit in accordance with another embodiment of the inventive concept. Referring to FIG. 5, the controller reception unit includes photo detectors PD1 and PD2 and a plurality of buffers AMP1, AMP2 and ADD.

The photo detectors PD1 and PD2 receive optical modulation signals OPTM from device optical transmission units of a memory device. The photo detectors PD1 and PD2 photoelectrically-convert the received optical modulation signals OPTM to output an electrical signal.

The buffer AMP1 amplifies an electrical signal which is an output of the photo detector PD1 to output an amplified electrical signal.

The buffer AMP2 amplifies an electrical signal which is an output of the photo detector PD2 to output an amplified electrical signal.

The buffer ADD adds output signals of the buffers AMP1 and AMP2 to output a data signal DATA.

The controller optical reception unit amplifies output signals of photo detectors through separate buffers and then adds the amplified signals to restore a data signal. Thus, an input capacitance of the buffer is reduced and thereby a higher signal bandwidth can be embodied.

Figure 6:
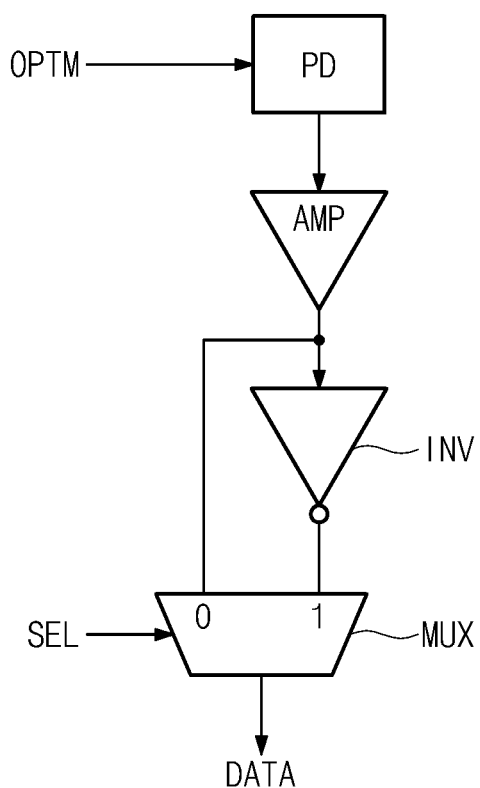
FIG. 6 is a drawing illustrating a device optical reception unit in accordance with another embodiment of the inventive concept.

FIG. 6 is a drawing illustrating a device optical reception unit in accordance with another embodiment of the inventive concept. Referring to FIG. 6, the device optical reception unit includes a photo detector PD, a buffer AMP, an inverter INV and a multiplexer MUX.

The optical detector PD receives an optical modulation signal OPTM from a controller optical transmission unit. The photo detector PD photoelectrically-converts the received optical modulation signals OPTM to output an electrical signal.

The buffer AMP amplifies the electrical signal which is an output of the photo detector PD to output the amplified electrical signal. The electrical signal amplified by the buffer AMP is input to a first input stage of the multiplexer MUX.

The inverter INV inverts the electrical signal amplified by the buffer AMP to output the inverted electrical signal to a second stage of the multiplexer MUX.

The multiplexer MUX outputs a signal of the first input stage or a signal of the second input stage as a data signal DATA depending on a select signal SEL. For example, in the case that the digital value of the select signal SEL is '1', the multiplexer MUX outputs an electrical signal inverted by the inverter INV. In the case that the digital value of the select signal SEL is '0', an electrical signal amplified by the buffer AMP is output as a data signal DATA. The select signal SEL may be set in advance by the memory controller to be transmitted to memory devices.

In the case of applying the device optical reception unit illustrated in FIG. 6 to the device interface of the memory device, the device optical reception units of the device interfaces can be identically constituted. Thus, a process procedure of manufacturing the memory device may become more simplified.

Figure 7:
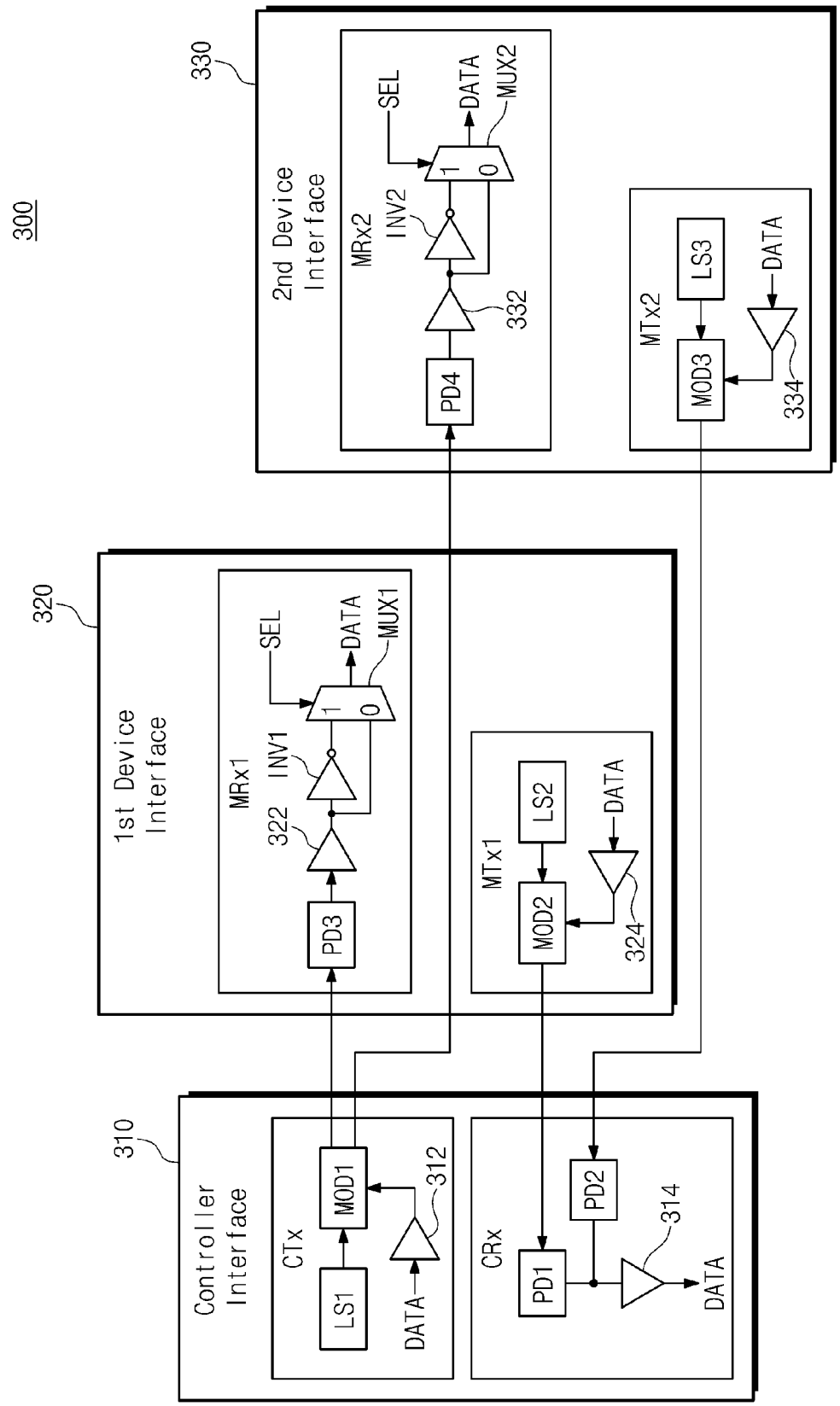
FIG. 7 is a block diagram illustrating a memory system including the device optical reception unit of FIG. 6 according to one exemplary embodiment.

FIG. 7 is a block diagram illustrating a memory system including the device optical reception unit of FIG. 6. Referring to FIG. 7, a memory system 300 includes a controller interface 310 and device interfaces 320 and 330. The controller interface 310 includes a controller optical transmission unit CTx and a controller optical reception unit CRx for transmitting/receiving data to/from the device interfaces 320 and 330 through an optical channel. The device interfaces 320 and 330 include device optical reception units MRx1 and MRx2 for receiving optical signals from the controller interface 310 and device optical transmission units MTx1 and MTx2 for transmitting optical signals to the controller interface 310.

The controller optical transmission unit CTx includes a light source LS1, a modulator MOD1, and a buffer 312. The controller optical reception unit RTx includes photo detectors PD1 and PD2 and a buffer 314. Since operations of the controller optical transmission unit CTx and the controller optical reception unit RTx are the same as those of the controller optical transmission unit and the controller optical reception unit of FIG. 2, further description thereof is omitted.

The device optical transmission unit MTx1 includes a light source LS2, a modulator MOD2, and a buffer 324. The device optical transmission unit MTx2 also includes a light source LS3, a modulator MOD3, and a buffer 334. Since operations of the device optical transmission units MTx1 and MTx2 are the same as those of the device optical transmission units of FIG. 2, further description thereof is omitted.

The device optical reception unit MRx1 includes a photo detector PD3, a buffer 322, an inverter INV1 and a multiplexer MUX1. The device optical reception unit MRx2 includes a photo detector PD4, a buffer 332, an inverter INV2 and a multiplexer MUX2.

The device optical reception units MRx1 and MRx2 receive optical modulation signals from the controller optical transmission unit CTx and convert the received optical modulation signals into electrical signals to output data signals DATA. The data signals DATA are signals that are selected by select signals SEL to be output. One of the input signals of each of the multiplexers MUX1, MUX2 is selected by a select signal SEL to be output.

For example, assume that a first optical modulation signal is transmitted from the controller optical transmission unit CTx to the device optical reception unit MRx1 of the first memory device and a second optical modulation signal is transmitted from the controller optical transmission unit CTx to the device optical reception unit MRx2 of the second memory device. Assume that the first optical modulation signal is a data signal which the memory controller wants to transmit to the memory devices, for example, an optical modulation signal corresponding to a digital value '1' and the second optical modulation signal is a data signal complementary to a data signal to be transmitted, that is, an optical modulation signal corresponding to a digital value '0'.

In this case, the device optical reception unit MRx1 of the first memory device only needs to output an electrical signal obtained by photoelectrically-converting the received first optical modulation signal as a data signal. However, the device optical reception unit MRx2 of the second memory device has to invert an electrical signal obtained by photoelectrically-converting the received second optical modulation signal again to output the inverted electrical signal as a data signal.

The device optical reception units MRx1 and MRx2 include the multiplexers MUX1 and MUX2 in common. The multiplexers MUX1 and MUX2 selectively output an electrical signal obtained by photoelectrically-converting the received first optical modulation signal in response to the select signal SEL or a signal obtained by inverting the electrical signal. The select signal SEL may be a signal which is set in advance by the memory controller to be transmitted to memory devices.

In the above-described case, the memory controller can transmit a select signal SEL having a logic high value to the first memory device and a select signal SEL having a logic low value to the second memory device. The device optical reception units MRx1 and MRx2 of the first and second memory devices which received the select signal SEL may output a data signal corresponding to a digital value '1'.

Since in the memory system 300 including the device optical reception unit of FIG. 6, the device interfaces of the memory devices are constituted by the same constituent elements, a manufacturing process of the memory device may become simplified and thereby production cost may be reduced.

Figure 8A:
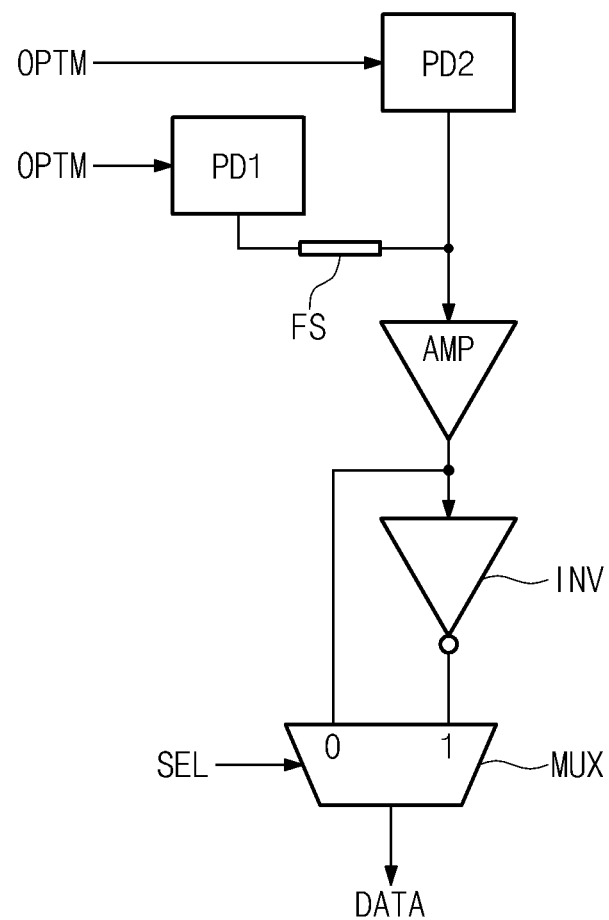
FIG. 8A is a drawing illustrating a controller optical reception unit in accordance with still another embodiment of the inventive concept.

FIG. 8A is a drawing illustrating a controller optical reception unit in accordance with still another embodiment of the inventive concept. Referring to FIG. 8A, the controller optical reception unit CRx includes photo detectors PD1 and PD2, a fuse FS, a buffer AMP, an inverter INV and a multiplexer MUX.

The photo detectors PD1 and PD2 are optically connected to the device optical transmission units MTx1 and MTx2 respectively to receive the optical modulation signals OPTM. The optical modulation signals OPTM may be signals corresponding to read data read out of the memory cores in response to read commands. The photo detectors PD1 and PD2 photoelectrically-convert the received optical modulation signals OPTM to output electrical signals.

The buffer AMP amplifies the electrical signals output from the photo detectors PD1 and PD2 to output amplified electrical signals. The inverter INV inverts the electrical signals amplified by the buffer AMP to output inverted electrical signals to an input stage of the multiplexer MUX.

The multiplexer MUX selectively outputs an output signal of the inverter INV or an output signal of the buffer AMP in response to a select signal SEL. The select signal SEL may be a signal set in advance by the memory controller. For example, in the case that the device optical transmission unit transmits an optical modulation signal corresponding to the readout data signal, the memory controller can set the select signal SEL as a logic low value.

Figure 8B:
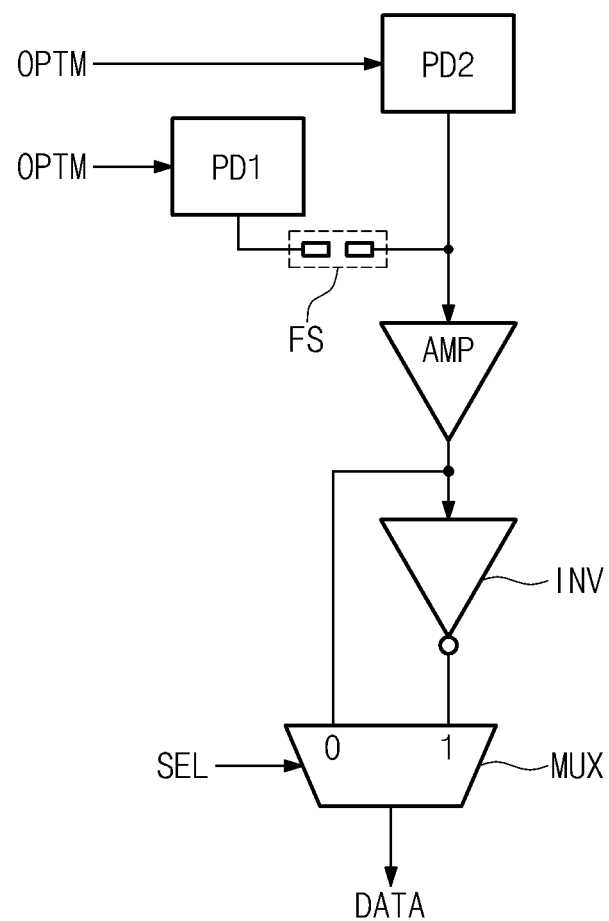
FIG. 8B is a drawing illustrating a device optical reception unit in accordance with still another embodiment of the inventive concept.

FIG. 8B is a drawing illustrating a device optical reception unit in accordance with still another embodiment of the inventive concept. Referring to FIG. 8B, the device optical reception unit includes photo detectors PD1 and PD2, a fuse FS, a buffer AMP, an inverter INV and a multiplexer MUX.

The photo detector PD2 receives an optical modulation signal OPTM from the controller optical transmission unit CTx of the memory controller. The photo detector PD2 photoelectrically-converts the received optical modulation signal OPTM to output an electrical signal. The photo detector PD1 is disconnected to an input stage of the buffer AMP by the fuse FS.

The buffer AMP amplifies the electrical signal output from the photo detector PD2 to output an amplified electrical signal.

The inverter INV inverts the electrical signal amplified by the buffer AMP to output an inverted electrical signal to an input stage of the multiplexer MUX.

The multiplexer MUX selectively outputs an output signal of the inverter INV or an output signal of the buffer AMP in response to a select signal SEL. The select signal SEL may be a signal set in advance by the memory controller.

A difference between the controller optical reception unit of FIG. 8A and the device optical reception unit of FIG. 8B is a connection state between the photo detector PD1 and the buffer AMP. For example, the difference may be whether the photo detector PD1 and the buffer AMP are connected to or disconnected from each other by the fuse FS. The photo detectors of the controller optical reception unit are optically connected to the device optical transmission units respectively and receive optical modulation signals from the device optical transmission units respectively. However, in one embodiment, the photo detector of the device optical reception unit receives optical modulation signals only from the controller optical transmission unit. As illustrated in FIG. 8A, in the case where two photo detectors are connected, a bandwidth may be reduced and power consumption may increase. Thus, in the case of the device optical transmission unit, performance reduction may be prevented by disconnecting a photo detector not being used from the buffer using a fuse as illustrated in FIG. 8B.

Figure 9:
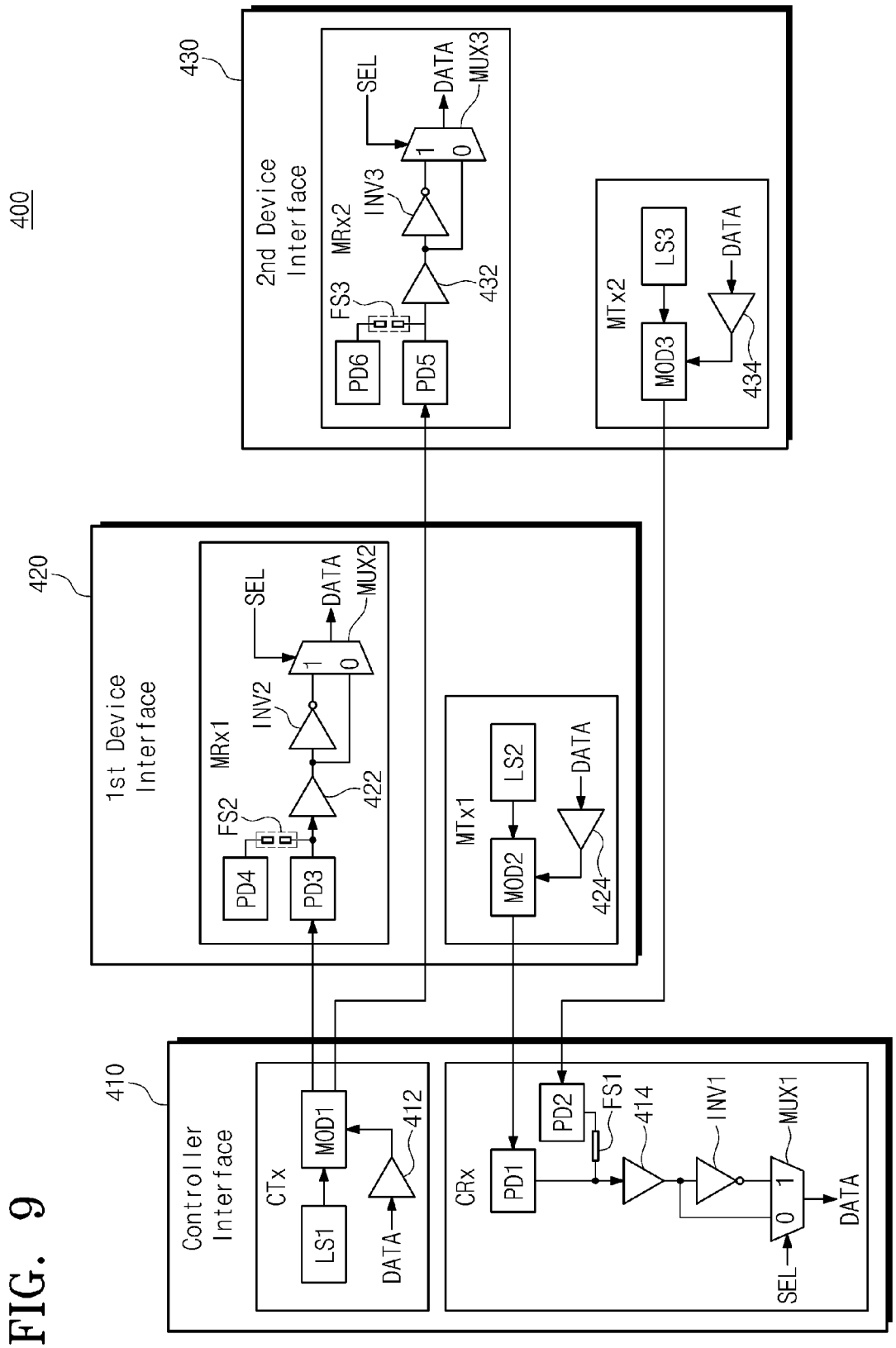
FIG. 9 is a memory block illustrating a memory system having the same optical reception unit structures in a controller interface and device interfaces according to an embodiment of the inventive concept.

FIG. 9 is a memory block illustrating a memory system having substantially the same optical reception unit structure in the controller interface and the device interfaces of the memory system in accordance with an embodiment of the inventive concept. Referring to FIG. 9, a memory system 400 includes a controller interface 410 and device interfaces 420 and 430. Herein, the controller optical reception unit of FIG. 8A is applied to a controller optical reception unit CRx of the controller interface 410 and the device optical reception unit of FIG. 8B is applied to device optical reception units MRx1 and MRx2 of the device interfaces 420 and 430.

A controller optical transmission unit CTx of the controller interface 410 includes a light source LS1, a modulator MOD1 and a buffer 412. Since the constituent elements of the controller optical transmission unit CTx are the same as those of the controller optical transmission unit CTx of FIG.

7 and operations of the controller optical transmission unit CTx are the same as those of the controller optical transmission unit CTx of FIG. 7, further description thereof is omitted.

A device optical transmission unit MTx1 of the first device interface 420 includes a light source LS2, a modulator MOD2 and a buffer 424. Since the constituent elements of the device optical transmission unit MTx1 are the same as those of the device optical transmission unit MTx1 of FIG. 7 and operations of the device optical transmission unit MTx1 are the same as those of the device optical transmission unit MTx1 of FIG. 7, further description thereof is omitted.

A device optical transmission unit MTx2 of the second device interface 430 includes a light source LS3, a modulator MOD3 and a buffer 434. Since the constituent elements of the device optical transmission unit MTx2 are the same as those of the device optical transmission unit MTx2 of FIG. 7 and operations of the device optical transmission unit MTx2 are the same as those of the device optical transmission unit MTx2 of FIG. 7, further description thereof is omitted.

The controller optical reception unit CRx includes photo detectors PD1 and PD2, a buffer 414, an inverter INV1 and a multiplexer MUX1. Since the constituent elements of the controller optical reception unit CRx are the same as those of the controller optical reception unit of FIG. 8A, further description thereof is omitted.

The device optical reception unit MRx1 includes photo detectors PD3 and PD4, a buffer 422, an inverter INV2 and a multiplexer MUX2, and the photo detector PD4 is disconnected from the buffer 422 by a fuse FS2.

The device optical reception unit MRx2 includes photo detectors PD5 and PD6, a buffer 432, an inverter INV3 and a multiplexer MUX3, and the photo detector PD6 is disconnected from the buffer 432 by a fuse FS3.

Since in the memory system 400 of FIG. 9, constituents of the optical reception units CRx, MRx1 and MRx2 are the same, a manufacturing process becomes simplified and manufacturing cost can be reduced. Similarly, the constituents of each of the device optical transmission units MTx1 and MTx2 may be formed to be the same as those of the controller optical transmission unit CTx and only one output of a modulator of each of the device optical transmission units MTx1 and MTx2 may be used. In this case, constituents of the optical transmission units CTx, MTx1 and MTx2 also become the same and thereby manufacturing cost may be further reduced.

Figure 10:
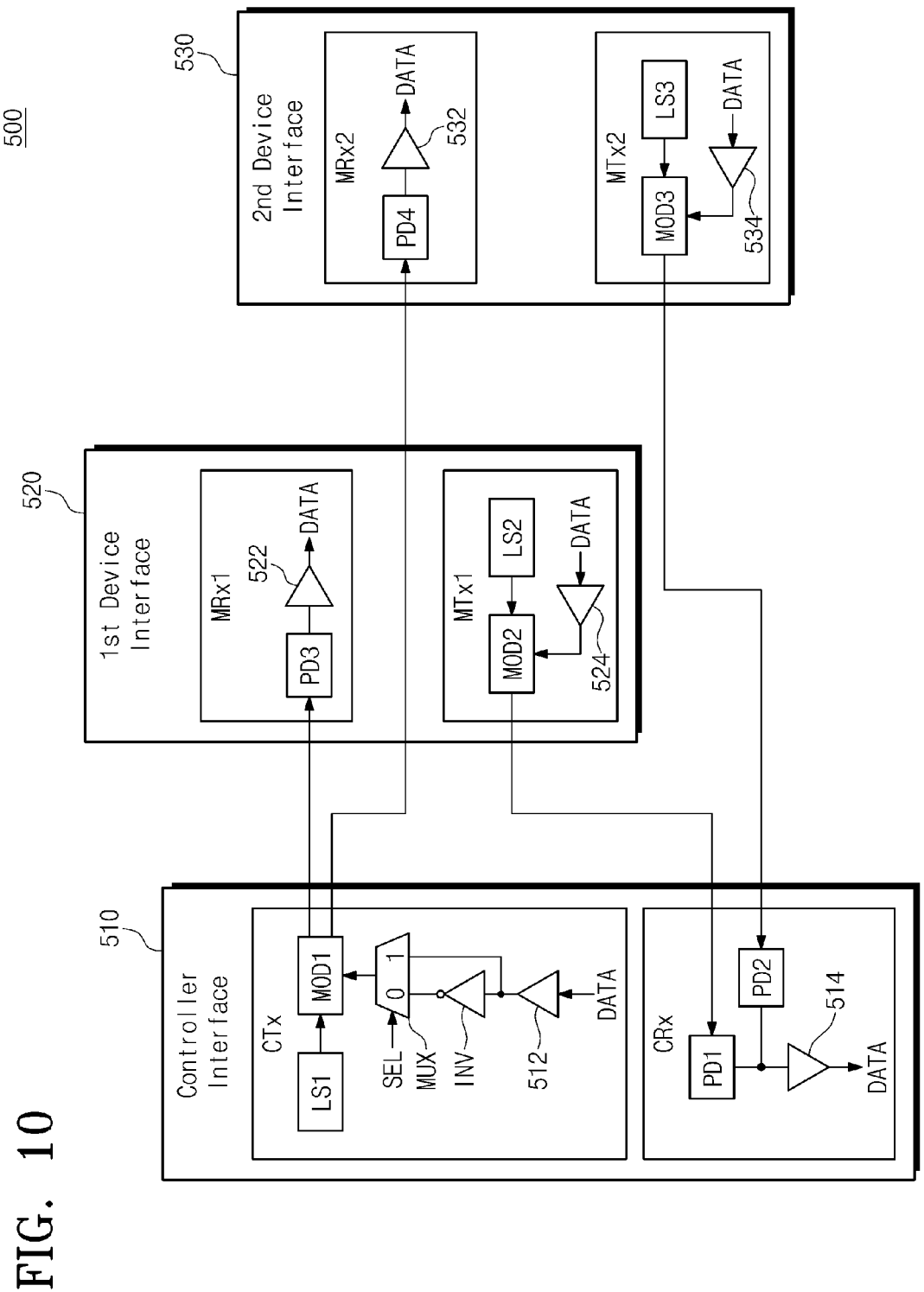
FIG. 10 is a block diagram illustrating a memory system in accordance with another embodiment of the inventive concept.

FIG. 10 is a block diagram illustrating a memory system in accordance with another embodiment of the inventive concept. Referring to FIG. 10, a memory system 500 includes a controller interface 510, a first device interface 520 and a second device interface 530. The memory system 500 controls an optical modulation signal to be transmitted from a controller optical transmission unit CTx to transmit it to device optical reception units MRx1 and MRx2.

The controller optical transmission unit CTx includes a buffer 512, an inverter INV, a multiplexer MUX, a light source LS1 and a modulator MOD1.

The buffer 512 amplifies a data signal DATA to output an amplified data signal DATA to the inverter INV and the multiplexer MUX. The inverter INV inverts the amplified data signal DATA to output it to the multiplexer MUX. The multiplexer MUX outputs the data signal DATA or the inverted data signal to the modulator MOD1 in response to a select signal SEL. The select signal SEL may be set by a memory controller depending on a data signal to be transmitted and a memory device to which a data signal is to be transmitted. The light source LS1 outputs an optical signal to the modulator MOD1. The modulator MOD1 modulates an optical signal to output optical modulation signals OPTM1 and OPTM2 in response to an output of the multiplexer MUX.

A controller optical reception unit CRx includes photo diodes PD1 and PD2 and a buffer 514. The photo diodes PD1 and PD2 and the buffer 514 correspond to the photo diodes PD1 and PD2 and the buffer 214 of the controller optical reception unit CRx of FIG. 2. Thus, further description of the controller optical reception unit CRx is omitted.

A device optical transmission unit MTx1 includes a buffer 524, a light source LS2, and a modulator MOD2. The buffer 524, the light source LS2, and the modulator MOD2 correspond to the buffer 224, the light source LS2, and the modulator MOD2 of the device optical transmission unit MTx1 of FIG. 2. Thus, further description of the device optical transmission unit MTx1 is omitted.

A device optical transmission unit MTx2 includes a buffer 534, a light source LS3, and a modulator MOD3. The buffer 534, the light source LS3, and the modulator MOD3 correspond to the buffer 234, the light source LS3, and the modulator MOD3 of the device optical transmission unit MTx2 of FIG. 2. Thus, further description of the device optical transmission unit MTx2 is omitted.

The device optical reception unit MRx1 includes a photo detector PD3 and a buffer 522. The device optical reception unit MRx2 includes a photo detector PD4 and a buffer 532. Each of the device optical reception units MRx1 and MRx2 is constituted by one photo detector and one buffer. Thus, the structures of the device optical reception units MRx1 and MRx2 are simple as compared with those of the device optical reception units of FIGS. 2, 7 and 8.

Since in the memory system 500 of FIG. 10, the structures of the device optical reception units are simple, the manufacturing process of a memory becomes simple and the area of the interface can be reduced. Thus, in the case that one memory controller is optically connected to plural memory devices, production cost can be reduced by applying the memory system 500 of FIG. 10.

Figure 11:
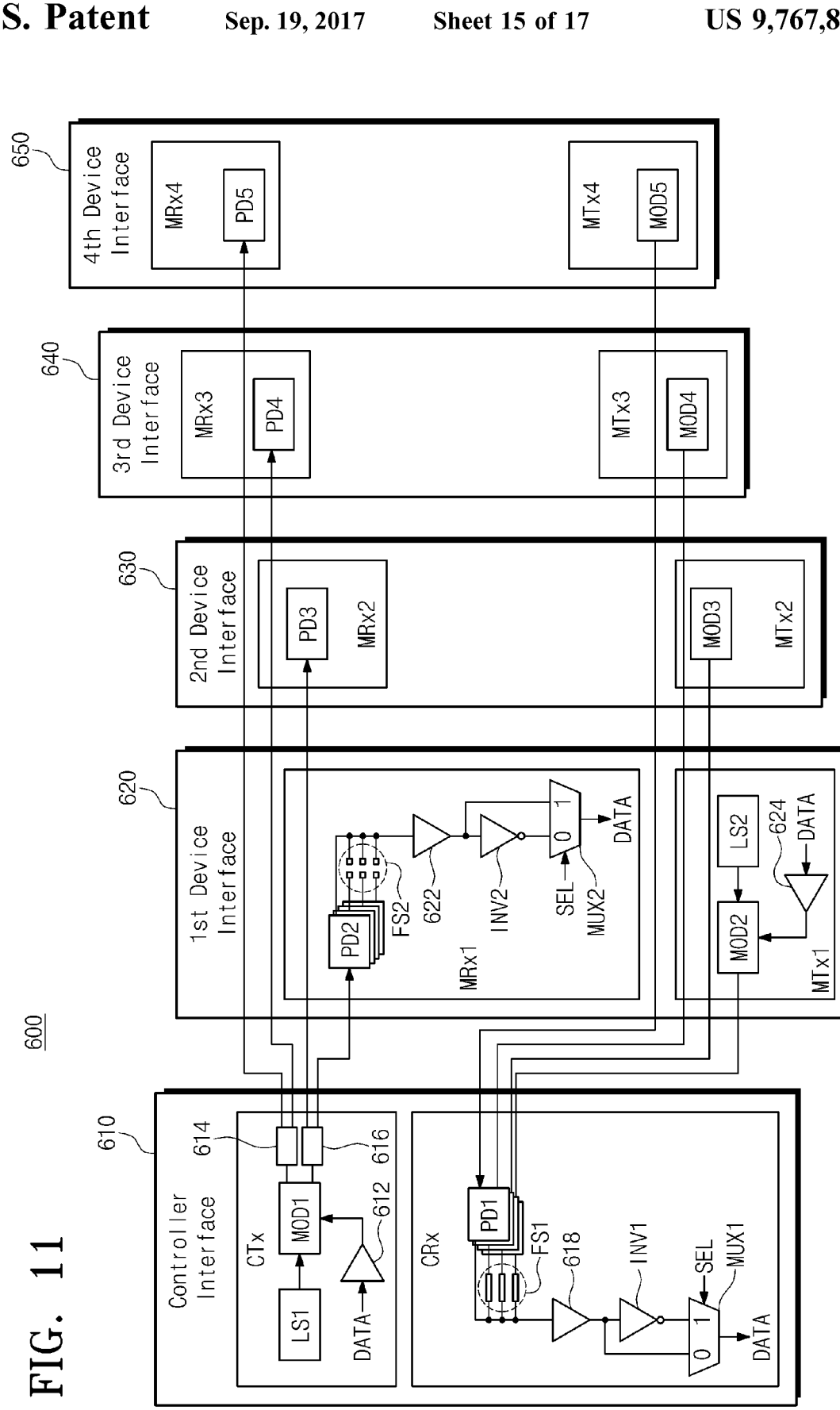
FIG. 11 is a block diagram illustrating a memory system of a four split structure in accordance with an embodiment of the inventive concept.

FIG. 11 is a block diagram illustrating a memory system of a four split structure in accordance with an embodiment of the inventive concept. Referring to FIG. 11, a memory system 600 includes a controller interface 610, first through fourth device interfaces 620, 630, 640 and 650.

The controller interface 610 includes a controller optical transmission unit CTx and a controller optical reception unit CRx.

The controller optical transmission unit CTx includes a buffer 612, a light source LS1, a modulator MOD1, and optical splitters 614 and 616. The buffer 612 drives the modulator MOD1 in response to a data signal DATA. The light source LS1 outputs an optical signal to the modulator MOD1. The modulator MOD1 modulates the optical signal in response to the data signal DATA to output two optical modulation signal complementary to each other. The optical splitters 614 and 616 split the outputted optical modulation signals to output four split optical modulation signals.

The controller optical reception unit CRx includes four photo detectors PD1, fuses FS1, a buffer 618, an inverter INV1 and a multiplexer MUX1. Since the constitution and the operation of the controller optical reception unit CRx are the same as those of the controller optical reception unit CRx of FIG. 9 except that the controller optical reception unit CRx of FIG. 11 has four photo detectors PD1 and three fuses, further description thereof is omitted.

The first device interface 620 includes a device optical transmission unit MTx1 and a device optical reception unit MRx1.

The device optical transmission unit MTx1 includes a buffer 624, a light source LS2 and a modulator MOD2. Since the constitution and the operation of the device optical transmission unit MTx1 of FIG. 11 may be the same as those of the device optical transmission unit MTx1 of FIG. 9, further description thereof is omitted.

The device optical reception unit MRx includes four photo detectors PD2, fuses FS2, a buffer 622, an inverter INV2 and a multiplexer MUX2. Since the constitution and the operation of the device optical reception unit MRx may be the same as those of the device optical reception unit MRx of FIG. 9 except that the device optical reception unit MRx of FIG. 11 has four photo detectors PD2 and three fuses, further description thereof is omitted.

As described above, to embody a memory system of four split structure, the optical splitters 614 and 616 are additionally used in each output stage of the modulator MOD1 of the controller optical transmission unit CTx. The controller optical reception unit CRx includes four photo detectors to receive optical modulation signals from four memory devices. The constitutions of the device optical reception units MRx1, MRx2, MRx3 and MRx4 are the same as that of the controller optical reception unit CRx. The photo detectors PD1 of the controller optical reception unit CRx are connected to an input stage of the buffer 618 by the fuses FS1 but the photo detectors PD2 of the device optical reception unit MRx1 are disconnected from the buffer 622 by the fuses FS2 except one photo detector.

Since the constitutions of the device optical reception units MRx2, MRx3 and MRx4 of the device interfaces 630, 640 and 650 may be the same as that of the device optical reception unit MRx1 of the device interface 620, a further description thereof is omitted. Since constitutions of the device optical transmission units MTx2, MTx3 and MTx4 of the device interfaces 630, 640 and 650 may be the same as that of the device optical transmission unit MTx1 of the device interface 620, a further description thereof is omitted.

Figure 12:
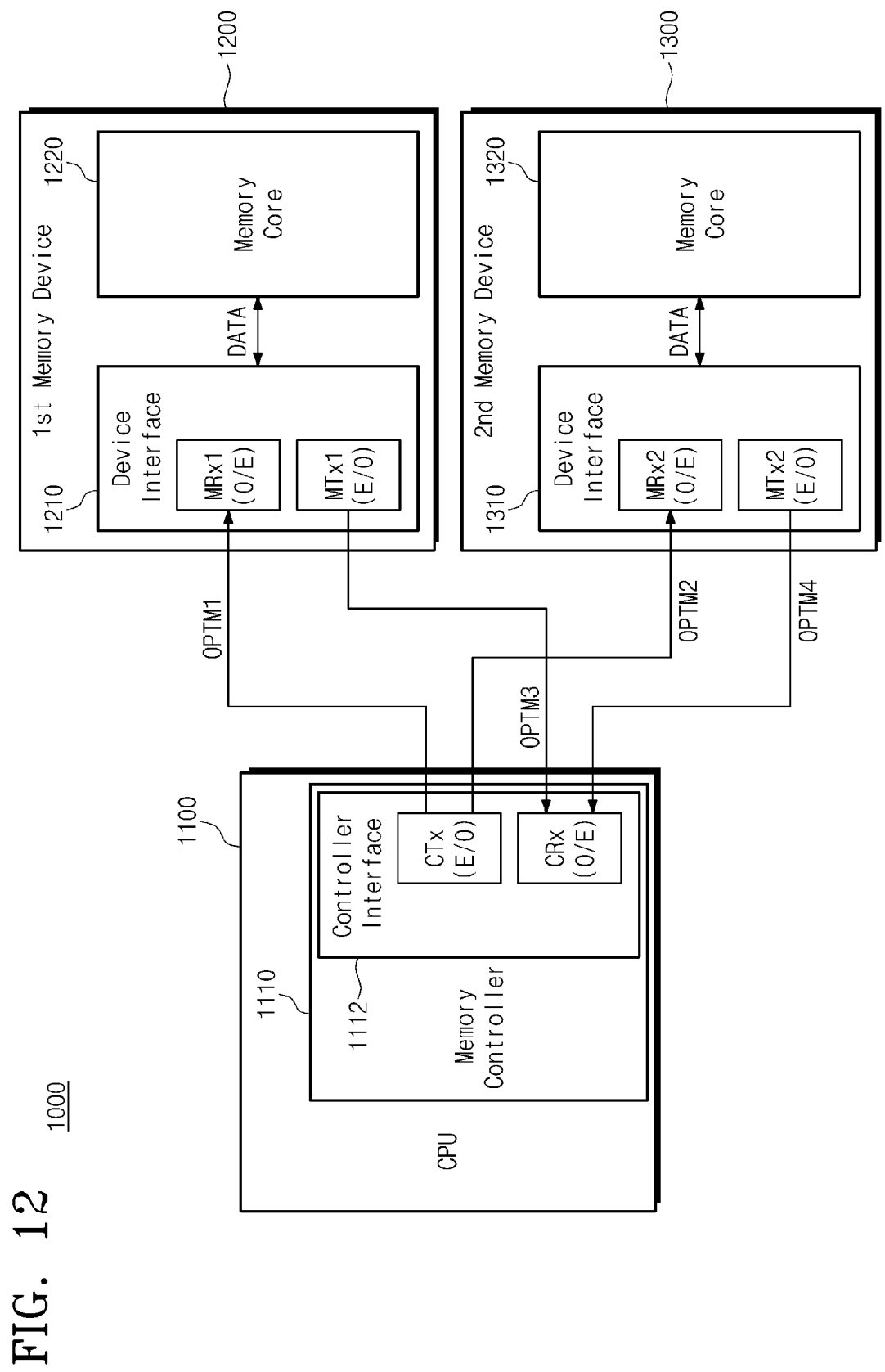
FIG. 12 is a block diagram illustrating a data processing system including a memory system in accordance with an embodiment of the inventive concept.

FIG. 12 is a block diagram illustrating a data processing system including a memory system in accordance with an embodiment of the inventive concept. Referring to FIG. 12, a data processing system 1000 includes a central processing unit CPU 1100, a first memory device 1200 and a second memory device 1300.

The CPU 1100 includes a memory controller 1110 for controlling an overall operation of the memory devices 1200 and 1300. The memory controller 1110 includes a controller interface 1112 for transmitting/receiving data to/from the memory devices 1200 and 1300. The controller interface 1112 may include a controller optical transmission unit CTx and a controller optical reception unit CRx for transmitting data to the memory devices 1200 and 1300 or receiving data from the memory devices 1200 and 1300.

The memory devices 1200 and 1300 may include device interfaces 1210 and 1310 and memory cores 1220 and 1320 respectively. The device interfaces 1210 and 1310 may include device optical transmission units MTx1 and MTx2 and device optical reception units MRx1 and MRx2 for transmitting/receiving data to/from the memory controller 1110 respectively. The CPU 1100 is optically interconnected to the memory devices 1200 and 1300.

The controller optical transmission unit CTx electrophotically-converts a data signal received from the CPU 1100 to transmit the converted data signal to the memory devices 1200 and 1300. The controller optical transmission unit CTx outputs two optical modulation signals OPTM1 and OPTM2 in response to the data signal. The optical modulation signals OPTM1 and OPTM2 are optical modulation signals corresponding to data signals complementary to each other. For example, if the first optical modulation signal OPTM1 is an optical modulation signal optically converted in response to a data signal of a logic high state, the second optical modulation signal OPTM2 is an optical modulation signal optically converted in response to a data signal of a logic low state.

The controller optical reception unit CRx receives optical modulation signals OPTM3 and OPTM4 from the memory devices 1200 and 1300. The controller optical reception unit CRx photoelectrically-converts the received optical modulation signals OPTM3 and OPTM4 to generate a data signal and can output the generated data signal to the CPU 1100.

The memory devices 1200 and 1300 may include the device interfaces 1210 and 1310 and the memory cores 1220 and 1320 respectively.

The device interface 1210 may include a device optical reception unit MRx1 receiving the first optical modulation signal OPTM1 from the controller interface 1112 and a device optical transmission unit MTx1 which electrophotically-converts a data signal DATA received from the memory core 1220 to transmit the converted data signal to the controller interface 1112.

The device interface 1310 may include a device optical reception unit MRx2 receiving the second optical modulation signal OPTM2 from the controller interface 1112 and a device optical transmission unit MTx2 which electrophotically-converts a data signal DATA received from the memory core 1320 to transmit the converted data signal to the controller interface 1112.

The memory cores 1220 and 1320 can write data received from a corresponding device interface in a corresponding memory cell in a write operation of the data processing system 1000. The memory cores 1220 and 1320 can read data stored in a corresponding memory cell to transmit the outputted data to a corresponding device interface in a read operation of the data processing system 1000.

The memory device 1200 and 1300 can be embodied by an optical DIMM (dual in-line memory module), an optical FB-DIMM (fully buffered DIMM), an optical SO-DIMM (small outline DIMM), an optical RDIMM (registered DIMM), an optical LRDIMM (load reduced DIMM), an optical UDIMM (unbuffered DIMM), an optical MicroDIMM, or an optical SIMM (single in-line memory module). The embodiments explained with reference to FIG. 12 may be embodied in an electronic device, for example, mobile devices.

Figure 13:
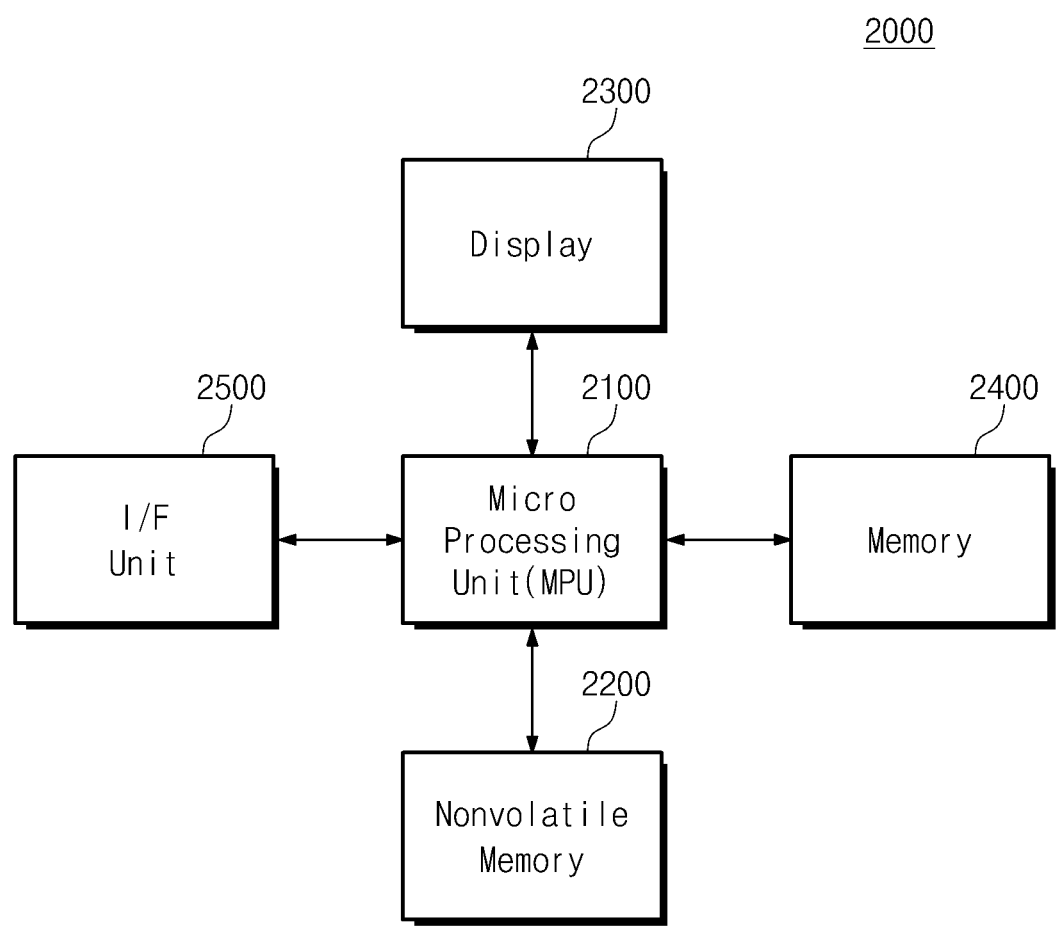
FIG. 13 is a block diagram illustrating a mobile device including a memory system in accordance with an embodiment of the inventive concept.

FIG. 13 is a block diagram illustrating a mobile device including a memory system in accordance with an embodiment of the inventive concept. Referring to FIG. 13, a mobile device 2000, for example, a notebook or a portable phone, may include a micro-processing unit MPU 2100, a nonvolatile memory 2200, a display 2300, a memory 2400 and an interfacing unit 2500.

The MPU 2100, the nonvolatile memory 2200 and the memory 2400 can be manufactured or packaged in one chip in some cases. For example, the nonvolatile memory 2200 and the memory 2400 can be embedded in the mobile device.

In the case where a mobile device is a portable communication device, a modem and a transceiver that perform a function of transmission/reception of communication data and a data modulation/demodulation may be connected to the interfacing unit 2500.

The memory 2400 is connected to the MPU 2100 and may be function as a buffer or main memory of the MPU 2100. The memory 2400 may be constituted by a plurality of memory devices like the memory devices of FIG. 1. The memory devices can be optically connected to the MPU 2100 to transmit/receive data.

The MPU 2100 controls an overall operation of the mobile device 2000. The MPU 2100 may include a memory controller such as illustrated in FIG. 1 to control an overall operation of the memory 2400. The memory controller can transmit a first optical modulation signal corresponding to a first data signal and a second optical modulation signal corresponding to a second data signal complementary to the first data signal to the memory devices. The mobile device does not use an optical splitter in an optical connection between the MPU 2100 and a plurality of memory modules. Thus, power consumption of a light source outputting an optical signal may be reduced compared with the case of using an optical splitter so that the battery of the mobile device may last longer.

The nonvolatile memory 2200 may be a NOR type flash memory or a NAND type flash memory, for example.

The display 2300 may have a touch screen as a liquid crystal having a backlight, a liquid crystal having a LED light source or an OLED device. The display 2300 functions as an output device displaying an image such as character, number, picture, etc. The display 2300 may be a color display or a monochrome display.

The mobile device was explained mainly with a mobile communication device, but the mobile device may function as a smart card by adding and subtracting constituent elements.

The mobile device can be connected to an external communication device through a separate interface. The communication device may be a digital versatile disc (DVD) player, a computer, a set top box (STB), a game machine, a digital camcorder, etc.

Although not illustrated in the drawing, the mobile device may further include an application chipset, a camera image processor, a mobile DRAM, etc.

Chips constituting the mobile device may be mounted using various types of packages such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), thin quad flat pack (TQFP), system in package (SIP), multi-chip package (MCP), wafer-level fabricated package (WFP) and wafer-level processed stack package (WSP).

The nonvolatile memory 2200 can store data information having various types of data such as text, graphic, software cord, etc.

The nonvolatile memory 2200 may be embodied by an electrically erasable programmable read-only memory (EE-PROM), a flash memory, a magnetic random access memory (MRAM), a spin-transfer torque MRAM, a conductive bridging RAM (CBRAM), a ferroelectric RAM (FeRAM), a phase change RAM (PRAM) which is called an ovonic unified memory (OUM), a resistive RAM (RRAM), a nanotube RRAM, a polymer RAM (PoRAM), a nanotube floating gate memory (NFGM), a holographic memory, a molecular electronics memory device, or an insulator resistance change memory.

According to aspects of the inventive concept, power consumption of a light source needed in an optical connection may be reduced.

According to aspects of the inventive concept, a manufacturing process of an electronic device or a memory device becomes simplified by making the constitution of an optical transmission unit equal to the constitution of an optical reception unit and thereby production cost thereof may be reduced.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A memory system comprising:
a memory controller comprising a controller optical transmission unit configured to electrophotically convert a data signal to output a first optical modulation signal and a second optical modulation signal;
a first memory device optically connected to the memory controller to receive the first optical modulation signal; and
a second memory device optically connected to the memory controller to receive the second optical modulation signal,
wherein the first optical modulation signal and the second optical modulation signal are complementary to each other.

2. The memory system of claim 1, wherein the controller optical transmission unit comprises:
a light source configured to output an optical signal; and
a modulation unit configured to modulate a phase of the optical signal in response to the data signal to output the first optical modulation signal and the second optical modulation signal.

3. The memory system of claim 2, wherein the modulation unit comprises:
an optical splitter configured to split the optical signal into a first optical signal and a second optical signal;
a phase modulator configured to modulate a phase of the first optical signal according to the data signal; and
a coupler configured to couple the first optical signal having a modulated phase to the second optical signal to output the first optical modulation signal and the second optical modulation signal.

4. The memory system of claim 3, wherein the coupler is a directional coupler or a multimode interference coupler.

5. The memory system of claim 3, wherein the modulation unit comprises:
a first wave guide configured to receive the optical signal to output the first optical modulation signal;
a circular-shaped wave guide configured to receive a part of the optical signal input into the first wave guide;
a phase modulation unit configured to modulate a phase of the optical signal received to the circular-shaped wave guide according to the data signal; and
a second wave guide configured to receive a part of the modulated optical signal from the circular-shaped wave guide to output the second optical modulated signal.

6. The memory system of claim 1, wherein each of the first memory device and the second memory device comprises a photo detector configured to convert an optical modulation signal received from the memory controller into an electrical signal corresponding to the data signal and a buffer amplifying the converted electrical signal, and the second memory device further comprises an inverter configured to invert the amplified electrical signal to output the inverted electrical signal.

7. The memory system of claim 1, wherein each of the first memory device and the second memory device comprises a device optical transmission unit configured to electrophotically-convert a data signal read in a read operation to output the electrophotically-converted data signal to the memory controller, and the memory controller comprises a controller optical reception unit configured to receive the electrophotically-converted data signal to output an electrical signal corresponding to the data signal read in the read operation.

8. The memory system of claim 7, wherein the controller optical reception unit comprises:

a first and a second photo detectors configured to receive optical signals from each device optical transmission unit of the first memory device and the second memory device and to convert the received optical signals into electrical signals; and a buffer configured to amplify the converted electrical signals to output amplified electrical signals, wherein the optical signals are electrophotically converted signals of data signals of the memory devices, and the electrical signals correspond to the data signals.

9. A memory controller comprising:

an optical signal transmitter configured to convert a data signal electrophotically, to output a first optical modulation signal and a second optical modulation signal, and to transmit the first optical modulation signal and the second optical modulation signal to a first memory device and to a second memory device respectively, wherein the first optical modulation signal and the second optical modulation signal are complementary to each other.

10. The memory controller of claim 9, further comprising:

a light source configured to output an optical signal; and a modulator configured to modulate the phase of the optical signal in response to the data signal to output the first optical modulation signal and the second optical signal.

11. The memory controller of claim 10, wherein the modulator comprises:

an optical splitter configured to split the optical signal into a first optical signal and a second optical signal;

a phase modulator configured to modulate the phase of the first optical signal according to the data signal; and a coupler configured to couple the first optical signal having a modulated phase to the second optical signal to output the first optical modulation signal and the second optical modulation signal.

12. The memory controller of claim 11, wherein the coupler is a directional coupler or a multimode inference coupler.

13. The memory controller of claim 9, further comprising:

an optical receiver configured to receive optical signals and convert the optical signals photoelectrically.

14. The memory controller of claim 13, wherein the optical receiver comprises:

a first and a second photo detectors configured to receive the optical signals and to convert the received optical signals into electrical signals; and a buffer configured to amplify the converted electrical signals to output amplified electrical signals.

15. An electronic device comprising a central processing unit configured to perform a data arithmetic operation and memory devices which are optically combined with the central processing unit to store data or read the stored data, wherein the central processing unit comprises an interface unit configured to interface with the memory devices, wherein the interface unit comprises:

an optical transmission unit configured to convert an electrical data signal into an optical signal to output a first optical modulation signal and a second optical modulation signal, wherein the first optical modulation signal and the second optical modulation signal are complementary to each other, wherein the first optical modulation signal is transmitted to a first memory device among the memory devices, and wherein the second optical modulation signal is transmitted to a second memory device among the memory devices.

16. The electronic device of claim 15, further comprising:

an optical reception unit configured to receive a third optical modulation signal obtained by electrophotically converting data read from the memory devices.

17. The electronic device of claim 16, wherein the optical transmission unit comprises:

a light source configured to output an optical signal; and a modulation unit configured to modulate a phase of the optical signal in response to the data signal to output the first optical modulation signal and the second optical modulation signal.

18. The electronic device of claim 17, wherein the modulation unit comprises:

a distributor configured to split the optical signal into a first optical signal and a second optical signal;

a phase modulation unit configured to modulate a phase of the first optical signal according to the data signal; and a coupler configured to couple the first optical signal having a modulated phase to the second optical signal to output the first optical modulation signal and the second optical modulation signal.

19. The electronic device of claim 18, wherein the coupler is a directional coupler or a multimode interference coupler.

20. The electronic device of claim 17, wherein the modulation unit comprises:

a first wave guide configured to receive the optical signal to output the first optical modulation signal;

a circular-shaped wave guide configured to receive a part of the optical signal inputted to the first wave guide;

a phase modulation unit configured to modulate a phase of the optical signal received to the circular-shaped wave guide according to the data signal; and a second wave guide configured to receive a part of the modulated optical signal from the circular-shaped wave guide to output a second optical modulation signal.

* * * * *